United States Patent
Lee et al.

(10) Patent No.: US 9,136,702 B2
(45) Date of Patent: Sep. 15, 2015

(54) ELECTROSTATIC DISCHARGE PROTECTION DEVICE AND COMPOSITE ELECTRONIC COMPONENT INCLUDING THE SAME

(71) Applicant: SAMSUNG ELECTRO-MECHANICS CO., LTD., Gyeonggi-do (KR)

(72) Inventors: Sang Moon Lee, Gyeonggi-do (KR); Sung Kwon Wi, Gyeonggi-do (KR); Ju Hwan Yang, Gyeonggi-do (KR); Won Chul Sim, Gyeonggi-do (KR); Young Do Kweon, Gyeonggi-do (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 146 days.

(21) Appl. No.: 13/843,860

(22) Filed: Mar. 15, 2013

(65) Prior Publication Data
US 2013/0335871 A1    Dec. 19, 2013

(30) Foreign Application Priority Data
Jun. 18, 2012   (KR) .................. 10-2012-0064942

(51) Int. Cl.
| | |
|---|---|
| H02H 7/24 | (2006.01) |
| H02H 9/04 | (2006.01) |
| H01T 4/08 | (2006.01) |
| H01T 4/10 | (2006.01) |
| H01C 1/14 | (2006.01) |
| H05K 1/02 | (2006.01) |
| H01C 7/12 | (2006.01) |

(52) U.S. Cl.
CPC .............. *H02H 9/044* (2013.01); *H01C 1/14* (2013.01); *H01T 4/08* (2013.01); *H01T 4/10* (2013.01); *H05K 1/026* (2013.01); *H01C 7/12* (2013.01); *H05K 2201/09736* (2013.01); *H05K 2201/09827* (2013.01)

(58) Field of Classification Search
USPC ........................................................ 361/112
See application file for complete search history.

(56) References Cited

U.S. PATENT DOCUMENTS

| | | | | |
|---|---|---|---|---|
| 4,586,105 | A  * | 4/1986 | Lippmann et al. | 361/117 |
| 5,864,208 | A  * | 1/1999 | McDonald | 313/592 |
| 6,937,454 | B2 * | 8/2005 | Mikolajczak et al. | 361/111 |
| 8,199,451 | B2 * | 6/2012 | Asakura et al. | 361/112 |
| 8,243,406 | B2 * | 8/2012 | Asakura et al. | 361/56 |
| 2007/0019346 | A1 * | 1/2007 | Kim et al. | 361/56 |
| 2007/0019354 | A1 * | 1/2007 | Kamath | 361/118 |
| 2010/0157501 | A1 * | 6/2010 | Asakura et al. | 361/112 |
| 2010/0176484 | A1 * | 7/2010 | Asakura et al. | 257/531 |
| 2011/0254004 | A1 * | 10/2011 | Yamazaki et al. | 257/57 |
| 2011/0279945 | A1 * | 11/2011 | Tsukizawa et al. | 361/220 |
| 2013/0201585 | A1 * | 8/2013 | Ikeda et al. | 361/56 |
| 2013/0335871 | A1 * | 12/2013 | Lee et al. | 361/56 |

FOREIGN PATENT DOCUMENTS

| | | |
|---|---|---|
| JP | 2010-027636 A | 2/2010 |
| JP | 2012-018902 A | 1/2012 |

* cited by examiner

*Primary Examiner* — Ronald W Leja
(74) *Attorney, Agent, or Firm* — McDermott Will & Emery LLP

(57) ABSTRACT

Disclosed herein are an electrostatic discharge protection device including: a substrate; a pair of electrodes formed on the substrate so as to be spaced apart from each other; and an insulating layer formed on the electrodes, wherein each of the electrodes has a shape in which it protrudes from a cross section thereof toward a surface thereof, and a manufacturing method thereof, and a composite electronic component including the same.

13 Claims, 3 Drawing Sheets

- PRIOR ART -

- PRIOR ART -

ELECTROSTATIC DISCHARGE PROTECTION DEVICE AND COMPOSITE ELECTRONIC COMPONENT INCLUDING THE SAME

CROSS REFERENCE(S) TO RELATED APPLICATIONS

This application claims the benefit under 35 U.S.C. Section 119 of Korean Patent Application Serial No. 10-2012-0064942, entitled "Electrostatic Discharge Protection Device and Composite Electronic Component Including the Same" filed on Jun. 18, 2012, which is hereby incorporated by reference in its entirety into this application.

BACKGROUND OF THE INVENTION

1. Technical Field

The present invention relates to an electrostatic discharge protection device and a composite electronic component including the same, and more particularly, to an electrostatic discharge protection device useful for a high speed transmission system or complexation with a common mode filter, and a composite electronic component including the same.

2. Description of the Related Art

Recently, miniaturization and high performance of electronic apparatuses have rapidly progressed. In addition, as generally represented by a high speed transmission system such as USB 2.0, S-ATA2, HDMI, or the like, the progress toward a high speed of a transmission rate (a high frequency exceeding 1 GHz) and a low driving voltage has been remarkably conducted.

On the other hand, in accordance with the miniaturization or the low driving voltage of the electronic apparatuses, withstand voltage of electronic components used in the electronic apparatuses is lowered. Therefore, a protection of the electronic components from overvoltage generally represented by an electrostatic pulse generated when a person's body contacts a terminal of the electronic apparatus is an important technical problem.

As the related art regarding an electrostatic discharge protection device, there is Japanese Patent Laid-Open Publication No. 2012-18902, which discloses an electrostatic discharge protection device 100 including an insulating substrate 11, a pair of electrodes 21 and 22 disposed on the insulating substrate 11 so as to be spaced apart from each other and face each other, a functional layer 31 disposed between the electrodes 21 and 22, and a plurality of intermediate electrodes 41 using the functional layer 31 and disposed so as to be spaced apart from the pair of electrodes 21 and 22, as shown in FIG. 1.

According to the above-mentioned patent, the functional layer 31 having a desired thickness is formed by using insulating inorganic materials 32 and conductive inorganic materials 33 and applying a publicly known method of forming a thin film, such as a vacuum deposition method, a reactive deposition method, a sputtering method, an ion plating method, a vapor method such as a chemical vapor deposition (CVD) method, a physical vapor deposition (PVD) method, or the like, on an insulating surface 11a and/or the electrodes 21 and 22 of the insulating substrate 11. For the functional layer 31, a composite in which the conductive inorganic materials are irregularly dispersed in a matrix of the insulating inorganic materials is used.

Therefore, in the case of including the functional layer 31 as in the above-mentioned patent, processes such as a thin film deposition, a filler dispersion, and the like, are added in order to add the insulating inorganic materials 32 and the conductive inorganic materials 33, such that the processes are complicated, and the productivity is deteriorated.

In addition, it can be appreciated from FIG. 2 that the conductive inorganic materials 33 are dispersed over the pair of electrodes 21 and 22, and an interval G therebetween. In the above-mentioned structure, there is the possibility that the conductive inorganic materials 33 will be irregularly dispersed in the insulating layer, such that a problem may occur in accurately designing withstand voltage, which is not preferable.

In addition, in the patent, an intermediate electrode (not shown) of the interval G between the electrodes, in addition to the pair of electrodes 21 and 22, is additionally included. As shown in FIG. 1, the pair of electrodes 21 and 22 are formed to be spaced apart from each other by a predetermined interval G, and the interval G has a range of 0.1~50 µm. That is, in the patent, the intermediate electrode, the conductive inorganic materials 33, or the like, in addition to the pair of electrodes 21 and 22, are used to secure withstand voltage characteristics.

RELATED ART DOCUMENT

Patent Document (Patent Document 1) JP Patent Laid-Open Publication No. 2012-18902

SUMMARY OF THE INVENTION

An object of the present invention is to provide an electrostatic discharge protection device having a structure in which processes such as a thin film deposition, a filler dispersion, and the like, according to the addition of a conductive inorganic material in an electrostatic discharge protection device according to the related art are not required, such that a manufacturing process is simplified, thereby making it possible to improve productivity.

Another object of the present invention is to provide an electrostatic discharge protection device capable of effectively preventing static electricity by increasing a field intensification factor due to a tunneling effect without additional components such as a conductive inorganic material, an intermediate electrode, and the like.

Still another object of the present invention is to provide a method of manufacturing the electrostatic discharge protection device.

Still another object of the present invention is to provide a composite electronic component including the electrostatic discharge protection device.

According to a first exemplary embodiment of the present invention, there is provided an electrostatic discharge protection device including: a substrate; a pair of electrodes formed on the substrate so as to be spaced apart from each other; and an insulating layer formed on the electrodes, wherein each of the electrodes has a shape in which it protrudes from a cross section thereof toward a surface thereof.

The pair of electrodes may protrude or any one of the pair of electrodes may protrude.

In the case in which the pair of electrodes protrude, an interval between the electrodes may have a range in which it is maintained as a minimum distance at which a tunneling effect is generated.

In the case in which the pair of electrodes protrude, lengths of each of the electrodes protruding from a cross section thereof may be the same as each other or different from each other.

A distal end of the protruded electrode may have a pointed shape selected from a circle shape, a coned shape, and a tapered shape.

The electrode may be made of at least one metal selected from a group consisting of Cu, Au, Cr, Al, Ag, Zn, W, Mo, Ni, Co, and Fe, or an alloy thereof.

The insulating layer of the electrostatic discharge protection device may be made of an organic material and an inorganic material.

In the case in which the insulating layer is formed by using the organic material, the organic material may be at least one insulating resin selected from a group consisting of an epoxy resin, a polyimide resin, a cyanate resin, a phenol resin, a polyethylene resin, a polypropylene resin, and an elastomer resin.

The inorganic material may be at least one selected from a group consisting of $Al_2O_3$, $TiO_2$, $SiO_2$, ZnO, $In_2O_3$, NiO, CoO, $SnO_2$, $V_2O_3$, CuO, MgO, $ZrO_2$, AlN, BN, and SiC.

The insulating layer may not include a conductive material.

According to a second exemplary embodiment of the present invention, there is provided a method of manufacturing an electrostatic discharge protection device, the method including: forming electrodes on a substrate; and forming an insulating layer on the electrodes.

The electrode may have a shape in which it protrudes from a cross section thereof toward a surface thereof.

The electrode may be formed by a photolithography process.

According to a third exemplary embodiment of the present invention, there is provided a composite electronic component including: a common mode filter layer formed between magnetic layers; and an electrostatic discharge protection device layer, wherein the electrostatic discharge protection device layer includes a substrate, a pair of electrodes formed on the substrate so as to be spaced apart from each other, and an insulating layer formed on the electrodes, each of the electrodes having a shape in which it protrudes from a cross section thereof toward a surface thereof.

DESCRIPTION OF THE PREFERRED EMBODIMENTS

Hereinafter, preferred embodiments of the present invention will be described in detail with reference to the accompanying drawings.

Terms used in the present specification are for explaining the embodiments rather than limiting the present invention. Unless explicitly described to the contrary, a singular form includes a plural form in the present specification. Also, used herein, the word "comprise" and/or "comprising" will be understood to imply the inclusion of stated constituents, steps, numerals, operations and/or elements but not the exclusion of any other constituents, steps, operations and/or elements.

The present invention discloses an electrostatic discharge protection device simplifying manufacturing processes by changing an electrode structure, a method of manufacturing the electrostatic discharge protection device so as to have excellent productivity, and a composite electronic component including the same.

Figure 3:
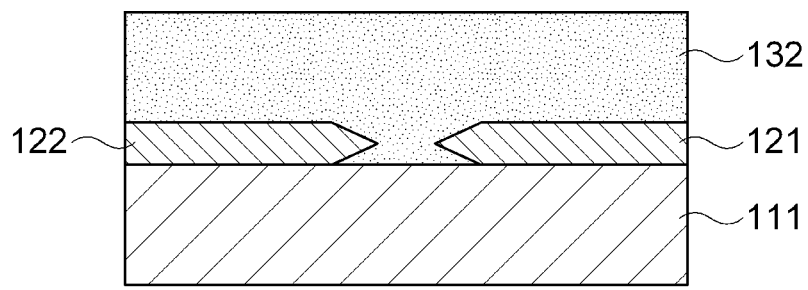
FIGS. 3 to 5 show a structure of an electrostatic discharge protection device of various exemplary embodiments of the present invention.

The electrostatic discharge protection device according to a first exemplary embodiment of the present invention includes a substrate 111; a pair of electrodes 121 and 122 formed on the substrate 111 so as to be spaced apart from each other; and an insulating layer 132 formed on the electrodes, wherein the electrodes 121 and 122 have a shape in which they protrude from each cross section thereof toward each surface thereof, as shown in FIG. 3.

If the substrate 111 according to the present invention may support the electrode or the insulating layer formed on the substrate 111, it is not specifically limited. Preferably, a substrate having insulating characteristics may be used in the present invention.

As the substrate 111, a ceramic substrate or a single crystal substrate may be used, and an insulating layer using low k-dielectric material may be formed on the substrate 111. The insulating layer may be formed by a vacuum deposition method, a reactive deposition method, a sputtering method, an ion plating method, a chemical vapor deposition (CVD) method, a physical vapor deposition (PVD) method, or the like, which is not specifically limited.

In addition, the electrostatic discharge protection device includes a pair of electrodes 121 and 122 provided on the substrate 111 and faced each other. In the electrostatic discharge protection device, a gap width needs to be narrowed, and accuracy thereof needs to be high, in order to improve characteristics in which electrostatic discharge (ESD) is suppressed by lowering peak voltage thereof.

Therefore, the electrodes 121 and 122 have ends having pointed shapes, and a minimum distance (hereinafter, referred to as a gap) between the electrodes having a tunneling effect therebetween.

Figure 4:
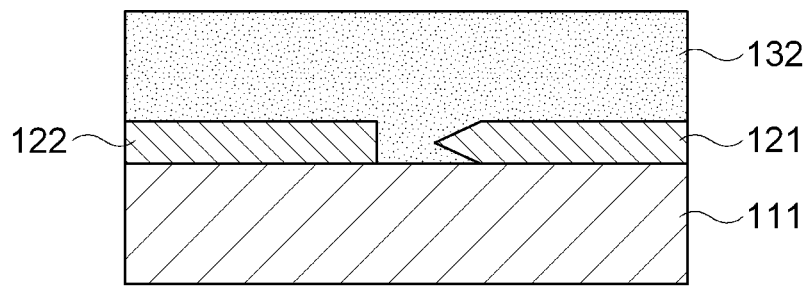

According to the first exemplary embodiment of the present invention, the pair of the electrodes 121 and 122 facing each other may have a protruded electrode structure (a symmetry structure) shown in FIG. 3, or only any one of the electrodes may have a protruded electrode structure (an asymmetry structure) shown in FIG. 4, which is not specifically limited.

In the first exemplary embodiment of the present invention, in the case in which the pair of electrodes 121 and 122 protrude, an interval (gap) between the electrodes may have a range in which it is maintained as a minimum distance at which the tunneling effect is generated. The 'tunneling effect' of the present invention means a phenomenon in which an electron passes an insulating layer having an energy barrier higher than the electron.

Therefore, an interval between the electrodes in the electrostatic discharge protection device according to the present invention is sufficient if only the interval in which the electrons are movable through the tunneling effect is maintained. In the case the interval between the electrodes is excessively wide, the tunneling effect may not be achieved, which is not preferable.

Figure 5:
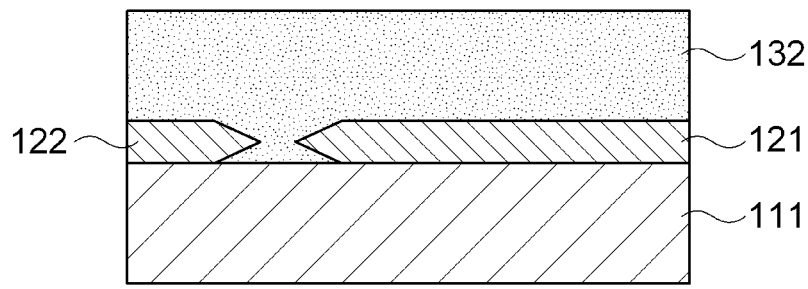

In the first exemplary embodiment of the present invention, in the case in which the pair of electrodes protrude, lengths at which the electrodes protrude from each electrode section may be the same as each other as shown in FIG. 3 or may be different from each other as shown in FIG. 5. Even in this case, the electrodes may contact to each other at the center or contact to each other at a position biased toward any one of the left and the right to form an asymmetrical structure. Meanwhile, the interval between the pair of electrodes facing each other is maintained so as to be an interval in which the tunneling effect is generated.

According to the first exemplary embodiment of the present invention, a shape of a distal end of the protruded electrode, that is, a portion at which electrodes contact to each other has a pointed shape selected from a circle shape, a coned shape, a tapered shape, and the like. In the case in which only one of any one of two electrodes protrudes, only one electrode may have a pointed shape.

The distal end of the electrode according to the present invention have pointed tip shapes, such that a field intensification factor is increased, thereby showing an electrostatic discharge protection effect under even lower voltage.

An Equation (Fowler-Nordheim equation) that explains the field intensification factor is represented by the following Equation 1.

$$\ln\left(\frac{1}{V^2}\right) = \ln\left(1.54 \times 10^{-6} \frac{\alpha\beta^2}{\Phi t^2(y)}\right) + \frac{4.26}{\sqrt{\Phi}} - 2.83 \times 10^7 \left(\frac{\Phi^{3/2}}{\beta V}\right) \quad \text{[Equation 1]}$$

where α indicates emission area (cm$^2$),
β indicates a field intensification factor (cm$^{-1}$),
Φ indicates work function, and
t$^2$(y) indicates a field-dependent correction factor.

Figure 6:
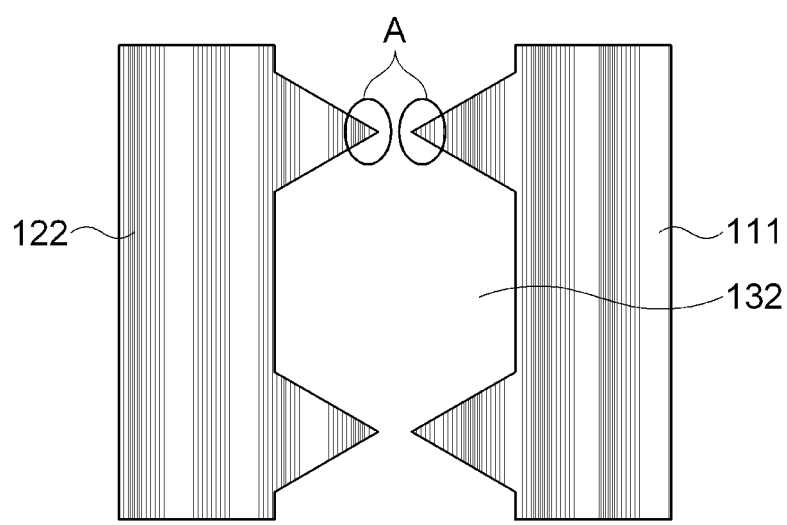
FIG. 6 shows a structure of an electrostatic discharge protection device including an insulating layer of the present invention.

Referring to the Equation 1, the distal end of the electrode structure are pointed according to the present invention (see a field improvement tip (A) shown in FIG. 6), such that the field intensification factor is increased, thereby showing the electrostatic discharge protection effect even under lower voltage.

The electrodes according to the present invention may be made of at least one metal selected from a group consisting of Cu, Au, Cr, Al, Ag, Zn, W, Mo, Ni, Co, and Fe, or an alloy thereof.

It is preferable that forming the electrodes 121 and 122 according to the present invention is performed by not using known methods, such as, a coating method, a transferring method, an electroplating method, an electroless plating method, a sputtering method, or the like, but a photolithography process, in order to effectively realize the electrode structure according to the present invention.

The photolithography process, which includes a series of processes such as coating, developing, and exposing processes by using the electrode materials on the substrate 111, is used for having a shape in which the electrode distal end is pointed according to the present invention. Each condition of the above-mentioned processes included in the photolithography process is not specifically limited, but corresponds to a general level.

A thickness of the electrode according to the present invention is not specifically limited if it has a level appropriate for the electrostatic discharge protection device, but is preferably about 1 to 10 μm.

In addition, the insulating layer of the electrostatic discharge protection device of the present invention may be formed by using an organic material and an inorganic material.

In the case in which the insulating layer is formed by using the organic material, the organic material may be at least one insulating resin selected from a group consisting of an epoxy resin, a polyimide resin, a cyanate resin, a phenol resin, a polyethylene resin, a polypropylene resin, and an elastomer resin.

In the case in which the insulating layer is formed by using the inorganic material, the inorganic material may be at least one selected from a group consisting of $Al_2O_3$, $TiO_2$, $SiO_2$, ZnO, $In_2O_3$, NiO, CoO, $SnO_2$, $V_2O_5$, CuO, MgO, $ZrO_2$, AlN, BN, and SiC.

According to the present invention, the insulating layer does not include a conductive inorganic material like the related art. Since an introduction of the conductive inorganic material needs additional separate processes, which deteriorates productivity. Therefore, in the present invention, it is possible that the insulating layer is formed without including the conductive inorganic material.

Figure 1:
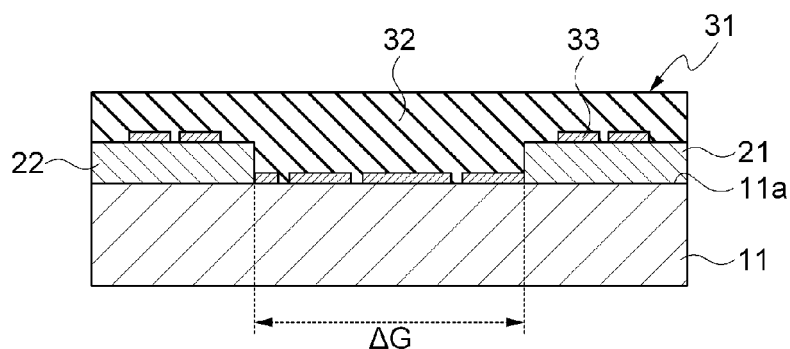
FIG. 1 shows a structure of an electrostatic discharge protection device of the related art (Patent Document 1).
Figure 2:
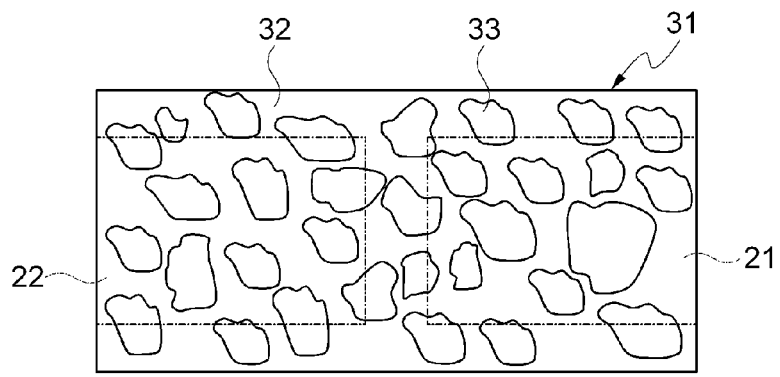
FIG. 2 is a plan view showing a functional layer of the electrostatic discharge protection device of the related art (Patent Document 1).

Therefore, it may be appreciated from FIG. 2 that the conductive inorganic materials 33 are randomly distributed to all of the electrodes 21 and 22, and the functional layer 31 in the electrostatic discharge protection device 100 of the related art; however, it may be appreciated from FIG. 6 that the conductive inorganic material is not included in the present invention. Accordingly, in the electrostatic discharge protection device according to the present invention, the processes are simplified, thereby making it possible to improve the productivity.

The method of manufacturing the electrostatic discharge protection device according to the present invention having the above-mentioned structure may include forming electrodes on a substrate, and forming an insulating layer on the electrodes.

First, electrodes are formed on a substrate, by using the above-mentioned materials for forming the electrodes through a photolithography method. The photolithography process includes performing coating with the materials for forming the electrodes, exposing, and developing processes, which correspond to general methods.

It is preferable that the each of the electrodes according to the exemplary embodiment of the present invention has a shape in which it protrudes from a cross section thereof toward a surface thereof, as shown in FIGS. 3 to 5. That is, the distal ends of the pair of electrodes facing each other, or any one of the distal ends thereof may have a pointed shape. Lengths of the pair of the electrodes are the same as each other or different from each other. Therefore, it is important to closely adhere the pair of electrodes to each other so that a minimum interval enough to generate an electrostatic discharge protection effect by increasing the field intensification factor due to the tunneling effect may be maintained therebetween.

Then, the insulating layer may be formed on the electrodes. The insulating layer may be made of the organic material or the inorganic material. In addition, it is preferable that the conductive inorganic material is not included in the insulating material.

A method of forming the insulating layer may include methods appropriate for the organic material or the inorganic material and known in the art, which is not specifically limited.

The electrostatic discharge protection device of the present invention manufactured by the processes may be used for a composite electronic component.

The composite electronic component of the first exemplary embodiment of the present invention includes a common mode filter layer formed between magnetic layers; and an electrostatic discharge protection device layer, wherein the electrostatic discharge protection device layer includes a substrate, and a pair of electrodes formed on the substrate so as to be spaced apart from each other; and an insulating layer formed on the electrodes, and each of the electrodes has a shape in which it protrudes from a cross section thereof toward a surface thereof.

Even though withstand voltage of the composite electronic component having the electrostatic discharge protection device layer may effectively protect is lowered due to miniaturization or a low operating voltage of an electronic apparatus, the composite electronic component may effectively protect the electronic components from overvoltage of the static electricity generated when a person's body contacts a terminal of the electronic apparatus.

As set forth above, according to the present invention, the processes such as the thin film deposition, the filler dispersion, and the like, for adding the conductive inorganic material used in the related art are removed, thereby making it possible to improve the productivity of the electrostatic discharge protection device at the time of manufacturing the electrostatic discharge protection device.

In addition, the electrostatic discharge protection device according to the present invention variously controls the shapes of the electrodes to accurately control the gap between the electrodes, thereby making it possible to control the peak voltage.

Therefore, in the case of including the electrode structure according to the present invention, the field intensification factor is increased due to the pointed tip shape of the portions contacting the electrodes, thereby making it possible to provide an excellent electrostatic discharge protection effect even in lower voltage.

Although the preferred embodiments of the present invention have been disclosed for illustrative purposes, those skilled in the art will appreciate that various modifications, additions and substitutions are possible, without departing from the scope and spirit of the invention as disclosed in the accompanying claims. Accordingly, such modifications, additions and substitutions should also be understood to fall within the scope of the present invention.

What is claimed is:

1. An electrostatic discharge protection device comprising:
   a substrate;
   a pair of electrodes spaced apart from each other on the substrate and
   a layer of insulating material on the pair of electrodes,
   wherein at least one electrode of the pair of electrodes includes a protruding portion, a bottom surface of the protruding portion noncontacing the substrate and covered with the insulating material, and wherein the protruding portion of the at least one electrode of the pair of electrodes is formed as a cone-shaped portion by a photolithography process.

2. The electrostatic discharge protection device according to claim 1, wherein both electrodes of the pair of electrodes include protruding portions, and the protruding portions of the pair of electrodes face one another.

3. The electrostatic discharge protection device according to claim 2, wherein in the case in which the pair of electrodes protrude, an interval between the electrodes has a range in which it is maintained as a minimum distance at which a tunneling effect is generated.

4. The electrostatic discharge protection device according to claim 2, wherein in the case in which the pair of electrodes protrude, lengths of each of the electrodes protruding from a cross section thereof are the same as each other or different from each other.

5. The electrostatic discharge protection device according to claim 1, wherein the electrodes are made of at least one metal selected from a group consisting of Cu, Au, Cr, Al, Ag, Zn, W, Mo, Ni, Co, and Fe, or an alloy thereof.

6. The electrostatic discharge protection device according to claim 1, wherein the layer of insulating material is made of an organic material and an inorganic material.

7. The electrostatic discharge protection device according to claim 6, wherein the organic material is at least one insulating resin selected from a group consisting of an epoxy resin, a polyimide resin, a cyanate resin, a phenol resin, a polyethylene resin, a polypropylene resin, and an elastomer resin.

8. The electrostatic discharge protection device according to claim 6, wherein the inorganic material is at least one selected from a group consisting of Al2O3, TiO2, SiO2, ZnO, In2O3, NiO, CoO, SnO2, V2Os, CuO, MgO, ZrO2, AlN, BN, and SiC.

9. The electrostatic discharge protection device according to claim 1, wherein the layer of insulating material does not include a conductive inorganic material.

10. A method of manufacturing an electrostatic discharge protection device, the method comprising:
    forming electrodes on a substrate; and
    forming a layer of insulating material on the electrodes, wherein at least one of the electrodes includes a protruding portion, a bottom surface of the protruding portion noncontacting the substrate and covered with the insulating material, and wherein the protruding portion of the at least one of the electrodes is formed as a cone-shaped portion by a photolithography process.

11. The method according to claim 10, wherein both electrodes include protruding portions, and the protruding portions of the electrodes face one another.

12. The method according to claim 10, wherein lengths of the electrodes protruding from a cross section thereof are different from each other.

13. A composite electronic component comprising:
    a common mode filter layer formed between magnetic layers; and
    an electrostatic discharge protection device layer, wherein the electrostatic discharge protection device layer includes a substrate, a pair of electrodes formed on the substrate so as to be spaced apart from each other, and a layer of insulating material formed on the pair of electrodes, wherein at least one of the pair of electrodes includes a protruding portion, a bottom surface of the protruding portion noncontacting the substrate and covered with the insulating material, and wherein the protruding portion of the at least one of the pair of electrodes is formed as a cone-shaped portion by a photolithography process.

* * * * *